United States Patent [19]

Rush

[11] Patent Number: 4,621,880
[45] Date of Patent: Nov. 11, 1986

[54] ELECTRICAL CONTACT ELEMENTS, CONNECTORS AND ASSEMBLIES

[75] Inventor: Derek A. Rush, London, England

[73] Assignee: Smiths Industries Public Limited Company, London, England

[21] Appl. No.: 749,856

[22] Filed: Jun. 28, 1985

[30] Foreign Application Priority Data

Jul. 11, 1984 [GB] United Kingdom ............... 8417646

[51] Int. Cl.⁴ ............................................. H01R 9/09
[52] U.S. Cl. ........................ 339/17 LC; 339/275 B
[58] Field of Search ............ 339/17 R, 17 C, 17 LC, 339/17 LM, 17 M, 275 B; 361/404, 405, 408

[56] References Cited

U.S. PATENT DOCUMENTS

| | | | |
|---|---|---|---|
| 2,972,728 | 2/1961 | Cole | 339/278 |
| 3,307,246 | 3/1967 | Gulliksen et al. | 339/17 R |
| 3,778,681 | 12/1973 | Wilson | 361/405 |
| 4,232,929 | 11/1980 | Zobawa | 339/17 LC |

FOREIGN PATENT DOCUMENTS

| | | |
|---|---|---|
| 2448296 | 4/1976 | Fed. Rep. of Germany ... 339/275 B |
| 83/01540 | 4/1983 | PCT Int'l Appl. . |
| 1314471 | 4/1973 | United Kingdom . |
| 1372279 | 10/1974 | United Kingdom . |
| 1568166 | 5/1980 | United Kingdom . |

Primary Examiner—Neil Abrams
Attorney, Agent, or Firm—Pollock, Vande Sande and Priddy

[57] ABSTRACT

An electrical connector for surface mounting on a printed circuit board has a rectangular plastics housing with two rows of contact pins. The pins are each in the form of a turned metal wire of circular section having an enlarged spherical knob at its rear end. Each pin extends parallel to the base of the housing, having its rear end bent downwards so that, in its natural state, the knob lies below the housing. When mounted on the circuit board, each knob is resiliently urged into contact with a respective printed contact pad on the board and is secured thereto by solder. The forward end of each pin provides a male member that makes connection in a socket in a cooperating connector.

10 Claims, 2 Drawing Figures

ELECTRICAL CONTACT ELEMENTS, CONNECTORS AND ASSEMBLIES

BACKGROUND OF THE INVENTION

This invention relates to electrical contact elements, and to electrical components, connectors and connector assemblies including contact elements.

The invention is more specifically concerned with contact elements of electrical components and connectors suitable for surface mounting on a printed circuit board.

Surface mounted components are conventionally connected in a circuit formed on a printed circuit board by soldering their contacts to conductive pads formed on the surface of the board. The soldered joint provides an electrical, and sometimes the mechanical connection, of the component with the board. The contact elements of such components usually take the form of a metal bar or strip of rectangular section that is bent downwards at an angle from the component to the conductive pad on the board, and bent parallel to the board surface close to its end. Such an arrangement can provide an effective and low-cost contact where the contacts are of this bar or strip form throughout their length, since they can be readily made by a pressing operation. In many components, however, the contacts are made by turning, to produce an element of cylindrical shape. Conventionally, with such components, one end of the contact is subsequently flattened and bent to produce a portion of rectangular section by which a solder connection can be made with a contact pad on the board surface. This additional forming operation leads to an increase in the cost of the contact.

BRIEF SUMMARY OF THE INVENTION

It is an object of the present invention to provide a contact element and an electrical component, connector and connector assembly including such a contact element that avoids the above disadvantage.

According to one aspect of the present invention there is provided an electrical contact element comprising a metal wire of substantially circular cross-section along the major part of its length, said wire being formed at one end with an enlarged portion of substantially spherical shape by which electrical connection to said contact element is established.

The enlarged portion may be substantially twice the diameter of the remainder of the wire. The wire may be bent along its length and the contact element made by a turning process.

According to another aspect of the present invention there is provided an electrical component including at least one contact element according to the said one aspect of the present invention.

According to a further aspect of the present invention there is provided an electrical connector including a housing and at least one electrical contact element projecting from said housing, said contact element comprising a metal wire of substantially circular cross-section along the major part of its length, said wire being formed at one end with an enlarged portion of substantially spherical shape by which electrical connection to said contact element is established.

The housing is preferably of an electrically-insulative material and has a flat base, a part of the contact element extending parallel to the base of the housing, and the one end of the contact element being bent towards the base. One end of the contact element may project below the base, in its natural state. The other end of the contact element may be formed either as a male member that is adapted for engagement within a socket in a cooperating connector, or as a female member that is adapted to receive within it a male member of a cooperating connector. The connector may have a plurality of contact elements.

According to an additional aspect of the present invention there is provided an electrical connector assembly including an electrical connector according to the further aspect of the present invention, and a circuit board having one or more respective electrical contact pads which is contacted by the enlarged portion at the one end of the or each contact element.

A layer of solder is preferably provided between the or each contact pad and the enlarged portion of the or each respective contact element.

An electrical connector assembly including a connector having several contact elements, in accordance with the present invention, will now be described, by way of example, with reference to the accompanying drawings.

DETAILED DESCRIPTION

Figure 1:
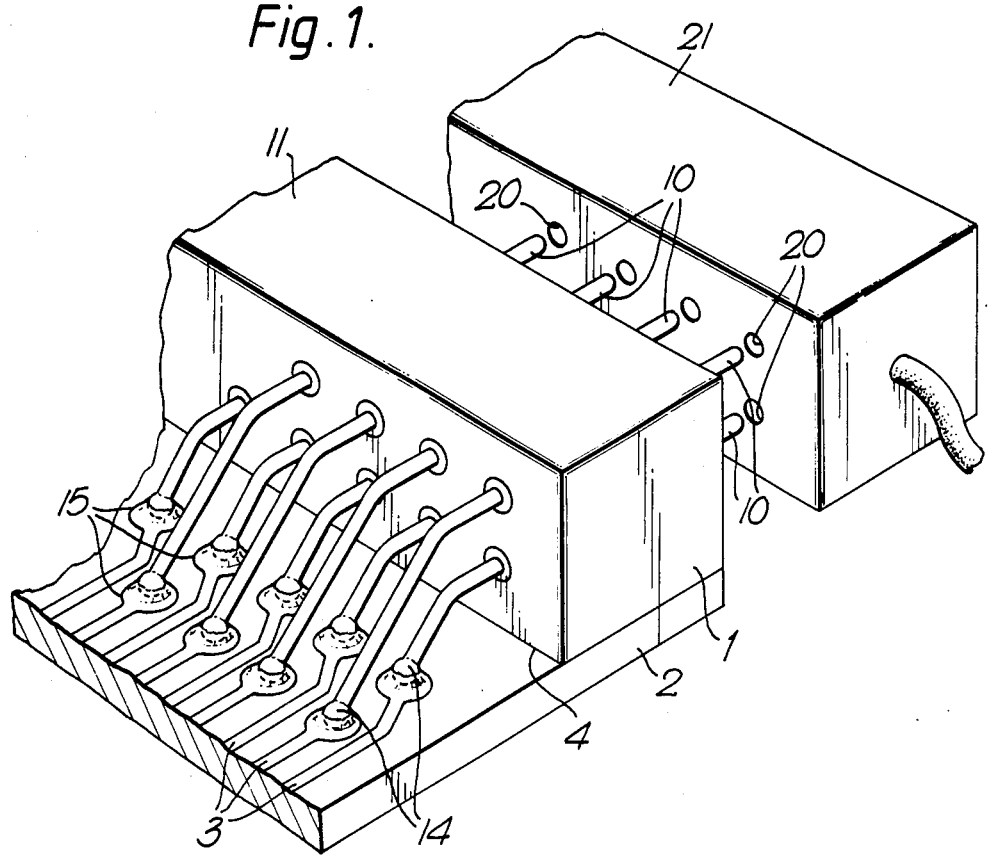
FIG. 1 is a perspective view of the connector.
Figure 2:
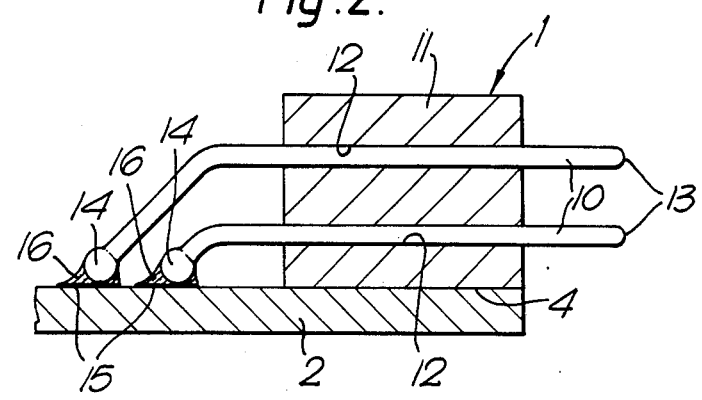
FIG. 2 is a sectional side elevation of the connector.

The connector assembly includes a connector 1 mounted on the upper surface of a printed circuit board 2. The board 2 carries on its surface a pattern of conductive tracks 3 which make electrical connection to various components (not shown) that are surface mounted on the board. An array of contact pins 10 project from the front edge of the connector 1, these pins being arranged electrically to engage sockets 20 in a cooperating connector 21. The contact pins 10 also project from the rear edge of the connector 1 where they make electrical connection with the conductive tracks 3.

The connector 1 comprises an electrically-insulative rectangular plastic housing or block 11 with a flat base 4, and of square section. The contact pins 10 extend through bores 12 through the block 11 and are arranged in two rows, one above the other. Each contact pin 10 is formed from a single metal wire of circular section. At its forward end 13 each pin is rounded to facilitate entry into the sockets 20 in the cooperating connector. The pins are straight until a short distance to the rear of the rear edge of the connector 1 where they are bent to incline downwards towards the surface of the board 2. At its rear end, each contact pin 10 is formed with an enlarged spherical knob 14 unitary with the remainder of the pin and approximately twice the diameter of the remainder of the pin. Each knob 14 contacts a respective electrical contact pad 15, electrical connection between the knob and the respective contact pad 15 being improved by a layer of solder 16 which is preferably formed by conventional flow soldering techniques.

In its natural state, before the connector 1 is mounted on the board 2, the knob 14 of each pin projects below the underside of the connector. When the connector 1 is mounted on the board 2, the pins 10 are bent up slightly and their resilience urges each knob 14 securely into contact with the respective contact pad 15. The resilience of the pins 10 provides good mechanical decoupling between the solder joint and the pin, thereby enabling any relative displacement between the board 2 and the pin or connector to be accommodated. The curved surface of the knob 14 ensures that any displacement by the pins 10 of the solder paste applied to the contact pad 15 is kept to a minimum, thereby reducing the risk that displaced solder will inadvertently bridge any joint. When melted, the solder migrates over the knob 14 so that it forms a good electrical and mechanical joint on cooling.

The pins 10 can be readily made by a turning operation, the knob 14 being produced at the same time. Preferably the pins 10 are straight when formed and are subsequently bent at the required angle after insertion in the plastics block 11.

It will be appreciated that the contact elements of the present invention could have a socket instead of a pin at the end remote from the enlarged knob. The contact element could be used in electrical components other than connectors.

What I claim is:

1. An electrical connector assembly comprising an electrical connector and a circuit board, the said connector including a housing mounted on one surface of said circuit board and at least one electrical contact element having one end supported in said housing, the said contact element projecting from said housing and comprising a metal wire of substantially circular cross-section along the major part of its length projecting from said housing, said contact element having an enlarged portion of substantially spherical shape at its other end, and the said circuit board having one or more respective substantially flat electrical contact pads on said one surface, each said respective contact pad being contacted by and soldered to the said enlarged portion at the other end of the or each contact element.

2. An electrical connector assembly according to claim 1, wherein a part of the contact element extends parallel to said surface, and wherein the said other end of the contact element is bent towards said surface.

3. In an electrical contact assembly of the kind comprising an electrically-insulative member mounted on a surface, an electrical contact element supported at one end by said electrically-insulative member, and a substantially flat contact pad mounted on said surface, the other end of said contact element being joined with said contact pad by means of an electrically-conductive settable joint material, the improvement wherein said contact element is in the form of a wire projecting from said electrically-insulative member, the major part of the length of said wire projecting from said electrically-insulative member being of substantially constant circular cross-section, the said length of wire being terminated at its said other end by an enlarged portion of substantially spherical shape, and the said enlarged portion being secured to said contact pad by said settable, electrically-conductive joint material so as thereby to establish electrical connection of said contact element with said contact pad.

4. An electrical contact element according to claim 3, wherein the enlarged portion is substantially twice the diameter of the remainder of the wire.

5. An electrical contact element according to claim 3, wherein the wire is bent along its length.

6. An electrical contact element according to claim 3, wherein the contact element is made by a turning process.

7. In a surface-mounted electrical connector of the kind comprising an electrically-insulative housing mounted on a surface, at least one electrical contact element supported at one end by said electrically-insulative housing, and a substantially flat contact pad mounted on said surface, the other end of said contact element being joined with said contact pad by means of an electrically-conductive settable joint material, the improvement wherein said contact element is in the form of a metal wire projecting from said housing, the major part of the length of the wire projecting from said housing being of substantially circular cross section, the said length of wire being terminated at its said other end by an enlarged portion of substantially spherical shape, and the said enlarged portion of the contact element being secured to said contact pad by said settable, electrically-conductive joint material so as thereby to establish electrical connection of said contact element with said contact pad.

8. An electrical connector according to claim 7 wherein a part of the contact element extends parallel to said surface, and wherein the said other end of the contact element is bent towards said surface.

9. An electrical connector according to claim 8, wherein in its natural state, the said other end of the contact element projects below the surface.

10. An electrical connector according to claim 7, wherein the one end of said contact element is formed as a male member that is shaped for engagement within a socket in a cooperating female connector.

* * * * *